(12) United States Patent
Sun et al.

(10) Patent No.: US 7,317,204 B2
(45) Date of Patent: Jan. 8, 2008

(54) TEST STRUCTURE OF SEMICONDUCTOR DEVICE

(75) Inventors: Min-chul Sun, Suwon-si (KR); Ja-hum Ku, Seongnam-si (KR); Brian J. Greene, Yorktown Heights, NY (US); Manfred Eller, Wappingers Falls, NY (US); Wee Lang Tan, Beacon, NY (US); Sunfei Fang, LaGrangeville, NY (US); Zhijiong Luo, Carmel, NY (US)

(73) Assignee: Samsung Electronics Co., Ltd., Suwon-Si, Geyonggi-do (KR)

( * ) Notice: Subject to any disclaimer, the term of this patent is extended or adjusted under 35 U.S.C. 154(b) by 46 days.

(21) Appl. No.: 11/218,397

(22) Filed: Sep. 2, 2005

(65) Prior Publication Data
US 2006/0163569 A1    Jul. 27, 2006

Related U.S. Application Data

(60) Provisional application No. 60/643,716, filed on Jan. 13, 2005.

(51) Int. Cl.
    *H01L 23/58* (2006.01)
(52) U.S. Cl. .......................... 257/48; 438/17; 438/18; 257/E21.521; 257/E21.522

(58) Field of Classification Search .................. 257/48, 257/327, 328, 377, 382–390, E21.521, E21.522; 438/17, 18
See application file for complete search history.

(56) References Cited

U.S. PATENT DOCUMENTS

| 6,586,837 B1* | 7/2003 | Suguro ....................... 257/751 |
| 2002/0109196 A1* | 8/2002 | Fujisawa et al. ............ 257/384 |

\* cited by examiner

*Primary Examiner*—Mary Wilczewski
*Assistant Examiner*—Paul Patton
(74) *Attorney, Agent, or Firm*—F. Chau & Associates, LLC.

(57) ABSTRACT

A test structure of a semiconductor device is provided. The test structure includes a semiconductor substrate, a transistor which includes a gate electrode formed on first and second active regions defined within the semiconductor substrate, and first and second junction regions which are arranged at both sidewalls of the gate electrode to reside within the first and second active regions and are silicided, and first and second pads through which electrical signals are applied to the silicided first and second junction regions and detected and which are formed on the same level as the gate electrode or the semiconductor substrate.

28 Claims, 14 Drawing Sheets

TEST STRUCTURE OF SEMICONDUCTOR DEVICE

CROSS REFERENCE TO RELATED APPLICATIONS

This application claims the benefit of U.S. Provisional Application No. 60/643,716 filed Jan. 13, 2005 in the United States Patent and Trademark Office, the disclosure of which is incorporated by reference herein.

BACKGROUND OF THE INVENTION

1. Field of the Invention

The present invention relates to a test structure of a semiconductor device, and more particularly, to a test structure of a semiconductor device capable of conducting a highly reliable test.

2. Description of the Related Art

As semiconductor devices continue to be highly integrated, the sheet resistance and contact resistance of the gate electrodes and source/drain regions of the MOS transistors increase, thereby increasing the resistance-capacitance delay time of the electrical signal that is applied to the gate electrodes of metal oxide semiconductor (MOS) transistors.

Accordingly, to produce high-performance MOS transistors suitable for highly integrated semiconductor devices, a silicide layer is formed on a gate electrode and a source/drain region of a MOS transistor. The silicide layer is usually formed by a self-aligned silicide (salicide) process.

After a metal layer for forming silicide is coated on the entire surface of a semiconductor substrate on which a gate electrode and a source/drain region of an MOS transistor are formed, a silicide layer is formed by performing a thermal treatment, such as a rapid thermal process (RTP). However, the silicide layer that is formed on the source/drain region may encroach into the lower parts of spacers formed at both side walls of the gate electrode. This is referred to as a lateral encroachment phenomenon. In a case where the lateral encroachment phenomenon is generated, the drain-off current Idoff of the MOS transistor is drastically increased just as the source/drain regions become short. The lateral encroachment phenomenon is undesirable because it degrades the electrical characteristics and reliability of the MOS transistors.

Accordingly, it would be desirable to have a test structure of a semiconductor device that is capable of determining whether lateral encroachment of silicide has occurred after performing a silicide formation process.

SUMMARY OF THE INVENTION

Disclosed is a reliable test structure capable of testing the semiconductor device during a silicide formation process.

According to an embodiment of the present invention, there is provided a test structure of a semiconductor device including a semiconductor substrate, a transistor which includes a gate electrode formed on first and second active regions defined within the semiconductor substrate, and first and second junction regions which are arranged at both sidewalls of the gate electrode to reside within the first and second active regions and are silicided, and first and second pads through which electrical signals are applied to the silicided first and second junction regions and detected and which are formed on the same level as the gate electrode or the semiconductor substrate.

According to another embodiment of the present invention, there is provided a test structure of a semiconductor device including a semiconductor substrate, a transistor array which includes a gate electrode formed on first and second active regions defined within the semiconductor substrate, and first and second junction regions which are arranged at both sidewalls of the gate electrode to reside within the first and second active regions and are silicided, first and second pads through which electrical signals are applied to the silicided first and second junction regions and detected and which are formed on the same level as the gate electrode, and first and second connecting portions which respectively connect the first and second pads to the first and second junction regions.

According to still another embodiment of the present invention, there is provided a test structure of a semiconductor device including a semiconductor substrate, a transistor array which includes a gate electrode formed on first and second active regions defined within the semiconductor substrate, and first and second junction regions which are arranged at both sidewalls of the gate electrode to reside within the first and second active regions and are silicided, and first and second pads through which electrical signals are applied to the silicided first and second junction regions and detected and which are formed on the same level as the semiconductor substrate.

BRIEF DESCRIPTION OF THE DRAWINGS

The present invention will become more apparent by describing in detail preferred embodiments thereof with reference to the attached drawings in which.

DETAILED DESCRIPTION OF PREFERRED EMBODIMENTS

Figure 1:
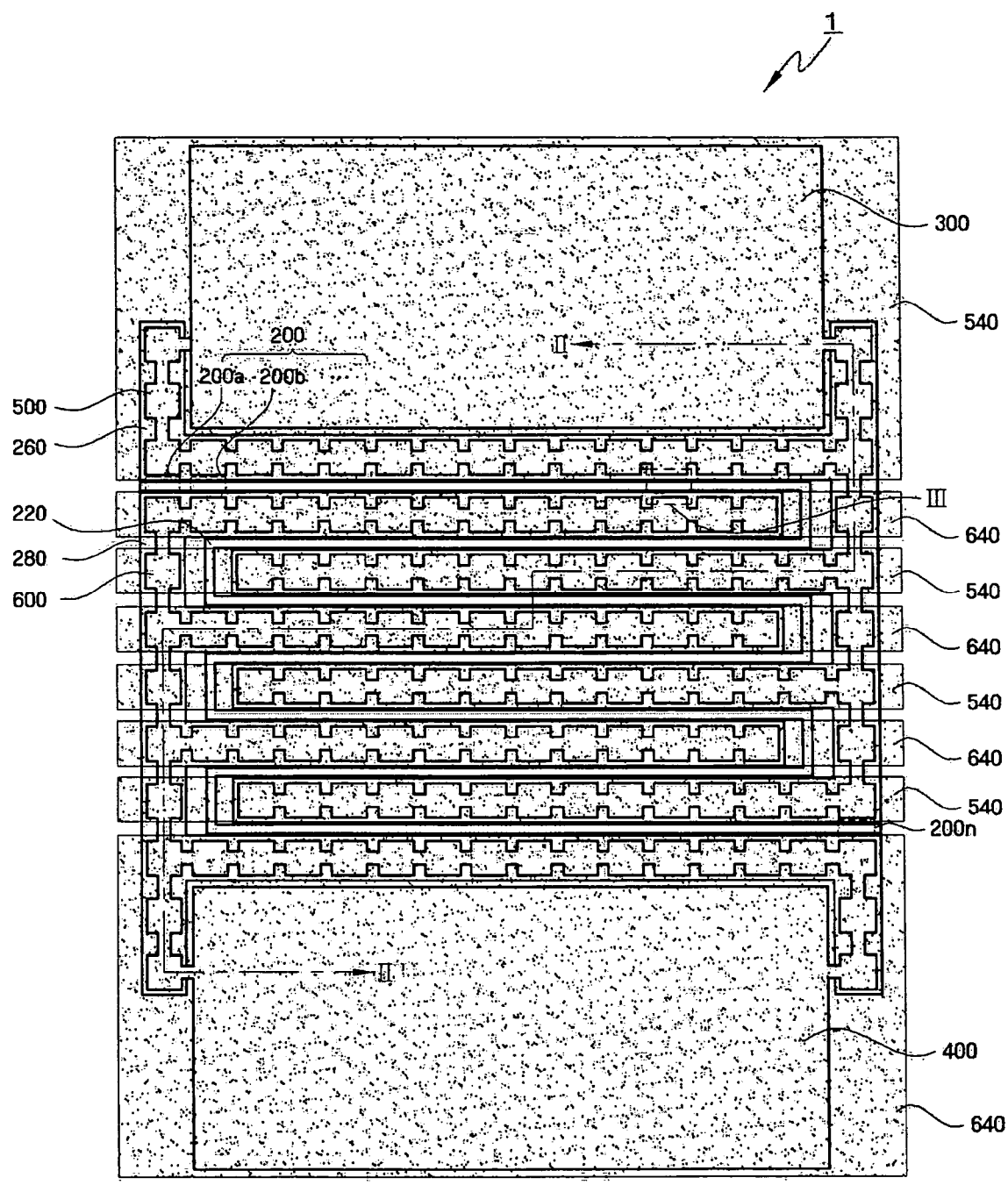
FIG. 1 is a layout diagram of a test structure of a semiconductor device according to one embodiment of the present invention.

The present invention and methods of accomplishing the same may be understood more readily by reference to the following detailed description of the preferred embodiments and the accompanying drawings. Like reference numerals refer to like elements throughout the specification.

Hereinafter, a test structure of a semiconductor device including first and second pads formed on the same level as a gate electrode of a transistor will be described with reference to FIGS. 1 through 8.

Figure 2:
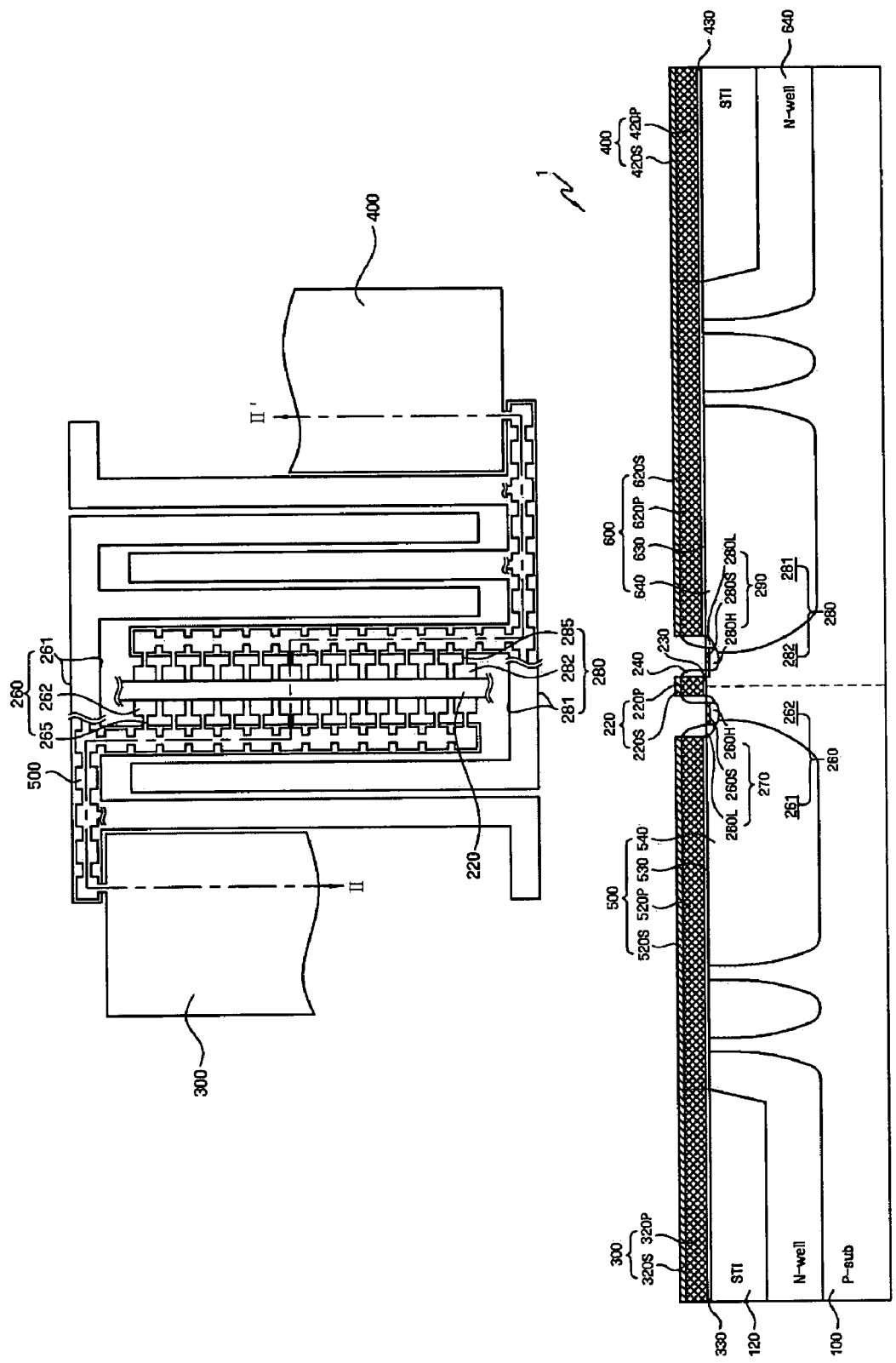
FIG. 2 together shows a cross-sectional view of the test structure, taken along a line II-II' shown in FIG. 1 and its layout diagram enlarged along the line II-II'.
Figure 3:
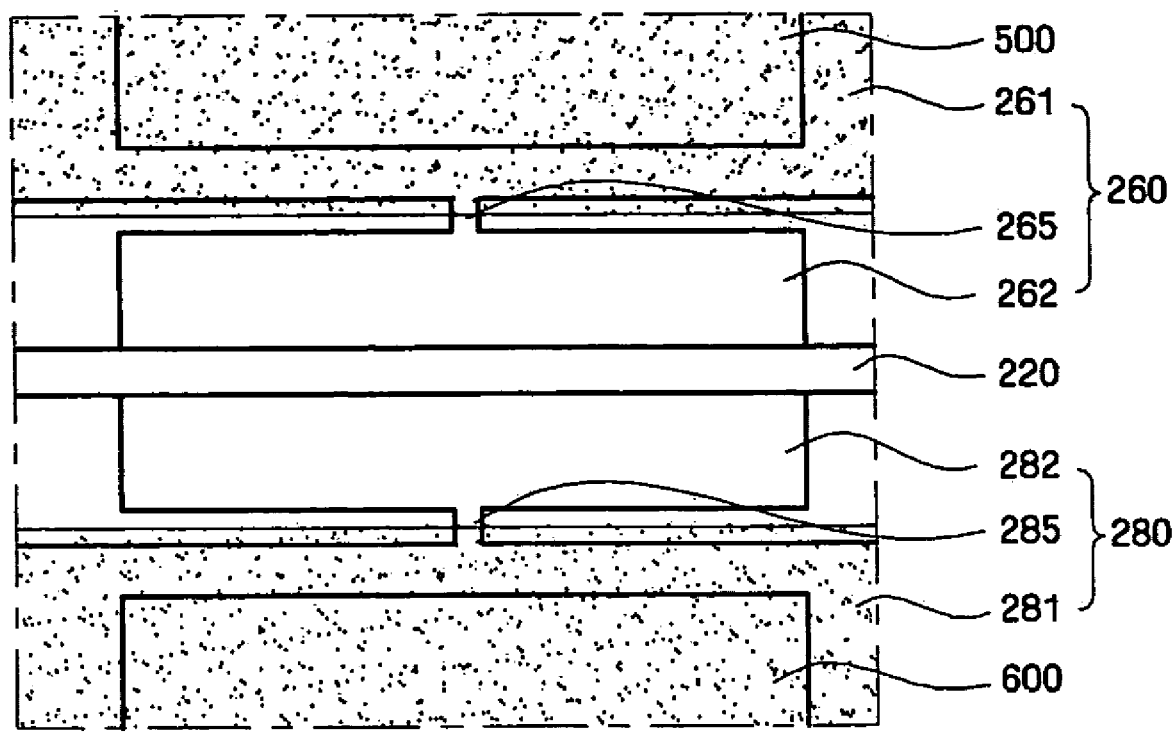
FIG. 3 is a partially enlarged layout diagram of a region III shown in FIG. 1.

FIG. 1 is a layout diagram of a test structure of a semiconductor device according to one embodiment of the present invention, FIG. 2 shows a cross-sectional view of the test structure, taken along a line II-II' shown in FIG. 1, and a layout diagram enlarged along the line II-II', and FIG. 3 is a partially enlarged layout diagram of a region III shown in FIG. 1. In FIG. 2, only first and second pads, first and second active regions, and connecting portions shown along the line II-II' are shown.

Referring to FIGS. 1 through 3, the test structure 1 of a semiconductor device according to one embodiment of the present invention includes a semiconductor substrate 100, a transistor array 200, a first pad 300, a second pad 400, a first connecting portion 500 and a second connecting portion 600.

The semiconductor substrate 100 can be formed of one or more semiconductor material selected from the group consisting of Si, Ge, SiGe, GaP, GaAs, SiC, SiGeC, InAs and InP. A p-type or n-type impurity doped substrate can be used as the semiconductor substrate 100. A field isolation region 120 is formed within the semiconductor substrate 100 to define first and second active regions 260 and 280 where the transistor array 200 is to be formed. The field isolation region 120 is generally a field oxide (FOX) region formed by local oxidation of silicon (LOCOS) or a shallow trench isolation (STI) region.

The transistor array 200 is formed on the first and second active regions 260 and 280. As shown in FIGS. 1 through 3, the first and second active regions 260 and 280 include first and second main active regions 261 and 281 arranged in a cross-finger array and a plurality of first and second sub-active regions 262 and 282 connected to the first and second main active regions 261 and 281, respectively, allowing the first and second active regions 260 and 280 to be interconnected. Further, the plurality of first and second sub-active regions 262 and 282 are arranged between the first and second main active regions 261 and 281 facing and opposite to each other, respectively, so that a plurality of transistors $200a, 200b, \ldots, 200n$ are formed on the plurality of first and second sub-active regions 262 and 282. The reason for forming the first and second main active regions 261 and 281 arranged in a cross-finger array is to improve the test accuracy by maximizing the areas of the first and second connecting portions 500 and 600 formed on the first and second main active regions 261 and 281. The reasons for forming the plurality of first and second sub-active regions 262 and 282 are that a statistical analysis of the test structure 1 of the semiconductor device can be performed and the accuracy of the statistical analysis is improved through the transistor array 200 by respectively forming the plurality of transistors $200a, 200b, \ldots, 200n$ in the plurality of first and second sub-active regions 262 and 282, which will be described in detail below.

Each of the plurality of transistors $200a, 200b, \ldots, 200n$ will now be described in more detail. A gate electrode 220 is insulated from the semiconductor substrate 100 and is formed on the plurality of first and second sub-active regions 262 and 282. A predetermined voltage is applied to the gate electrode 220, thereby forming a channel region on the lower part of the gate electrode 220. The gate electrode 220 can be formed by sequentially stacking a conductive polysilicon layer 220P and a silicide layer 220S obtained from a refractory metal such as Co, Ni, Ti, Hf, or Pt on top of a gate insulating layer 230. In one embodiment of the present invention, the gate electrode 220 is formed by sequentially stacking the conductive polysilicon layer 220P and a Ni-silicide layer 220S. In some cases, formation of the silicide layer 220S may be omitted. Meanwhile, $SiO_2$, $SiON$, $Si_3N_4$, $Ge_xO_yN_z$, $Ge_xSi_yO_z$, a material with a high dielectric constant or a staking layer thereof, and so on, can be used as the gate insulating layer 230. Further, spacers 240 can be formed at both sidewalls of the gate electrode 220.

First and second junction regions 270 and 290, that is, source/drain regions of each of the plurality of transistors $200a, 200b, \ldots, 200n$ are formed by doping n-type or p-type impurities on the first and second active regions 260 and 280 according to the type of the test structure 1 of the semiconductor device which is to be formed. The source/drain regions can include lightly doped drains 260L and 280L and heavily doped drains 260H and 280H. Further, the first and second junction regions 270 and 290 include silicide layers 260S and 280S. To detect occurrence of lateral encroachment of the silicide layer, the silicide layers 260S and 280S are formed on the upper parts of the first and second junction regions 270 and 290, which are arranged at both sidewalls of the gate electrode 220 and formed on the first and second active regions 260 and 280. The silicide layers 260S and 280S can be formed using a refractory metal such as Co, Ni, Ti, Hf, and Pt. An electrical signal can be applied to the silicided first and second junction regions 270 and 290 and detected through the first and second pads 300 and 400. In one embodiment of the present invention, the first and second pads 300 and 400 are formed on the same level as the gate electrode 220. Further, the first and second pads 300 and 400 are formed on the field isolation region 120. Accordingly, when a predetermined electrical signal is applied to the first and second pads 300 and 400 and detected using a probe, breaking of the active regions having a possibility of the occurrence can be prevented. Further, it is preferable that the first and second pads 300 and 400 are formed on the same level as the gate electrode 220 using the same material as the gate electrode 220. The first and second pads 300 and 400 can include the polysilicon layers 320P and 420P and the silicide layer 320S and 420S, which are sequentially formed on insulating layers 330 and 430.

The first and second connecting portions 500 and 600 connect the first and second pads 300 and 400 to the first and second junction regions 270 and 290, respectively. For example, the first and second connecting portions 500 and 600 are doped within the first and second main active regions 261 and 281. The first and second connecting portions 500 and 600 can have wells 540 and 640 of the same conductive type as the first and second junction regions 270 and 290, insulating layer 530 and 630 formed on the wells 540 and 640, and auxiliary pads 520 and 620 formed on the insulating layer 530 and 630, respectively.

Further, to completely connect the first and second pads 300 and 400 to the first and second junction regions 270 and 290, the wells 540 and 640 can be formed on lower parts of the first and second pads 300 and 400. For example, the plurality of wells 540 and 640 can be formed in the form of stripe along the first and second main active regions 261 and 281. Although not shown in the drawings, a well, for example, a p-type well of the same conductive type as that of the semiconductor substrate 100 can be formed between the wells 540 and 640 of a conductive type different from the p-type well according to an operation characteristic of the test structure 1 of the semiconductor device.

Here, it is preferable that the first and second connecting portions 500 and 600 are formed on the same level as the gate electrode 220 using the same material as the gate electrode 220. The auxiliary pads 520 and 620 can include the polysilicon layers 520P and 620P and the silicide layers 520S and 620S which are sequentially formed on the insulating layer 530 and 630.

Further, the first and second connecting portions 500 and 600 may be arranged in a cross-finger array on the first and second main active regions 261 and 281 arranged in a cross-finger array. In particular, the overall area of the first and second connecting portions 500 and 600 is sized and positioned such that the resistance of the first and second connecting portions 500 and 600 is smaller than the resistance of the transistor array 200. For example, the resistance of the first and second connecting portions 500 and 600 can be 100 or more times smaller than the resistance of the transistor array 200.

Meanwhile, the wells 540 and 640 having the same conductivity type as the first and second junction regions 270 and 290 are formed on the lower parts of the first and second main active regions 261 and 281. The semiconductor substrate 100 or a well (not shown) of the conductivity type opposite to the wells 540 and 640 is formed on lower parts of the first and second sub-active regions 262 and 282. As a result, a leakage current may occur at an interface between the wells 540 and 640 and the semiconductor substrate 100 or the well. Accordingly, the first and second main active regions 261 and 281 and the first and second sub-active regions 262 and 282 can be connected by contact active regions 265 and 285 having as narrow a width as possible. The contact active regions 265 and 285 are formed to have a width having the margin resolution of a photolithography process to minimize the amount of leakage current. Hereinafter, an operation of the test structure 1 of the semiconductor device according to one embodiment of the present invention will be described with reference to FIGS. 1, 4 and 5.

To detect the lateral encroachment phenomenon, a drain-off current Idoff is measured. For example, in a case of NMOS transistor as in FIG. 4, the semiconductor substrate 100 and the first pad 300 are connected to a ground voltage GND, the second pad 400 is connected to a positive voltage FORCE (+), and the gate electrode 220 is connected to the ground voltage GND or a negative voltage FORCE (−). Here, a current path is formed by the second pad 400, the second connecting portion 600, the transistor array 200, the first connecting portion 500 and the first pad 300. That is, the main current path is formed in an arrow direction indicated by b→a.

The current path (a) will first be described.

In one embodiment of the present invention, the first and second active regions 260 and 280 include the silicide layers 260S and 280S, respectively. Since a voltage that disturbs channel formation is applied to the gate electrode 220, the current path (a) is not formed in a normal transistor. However, if the lateral encroachment phenomenon occurs, the silicide layer 280S can be formed up to a lower part of the spacer 240 as in FIG. 4. If the lateral encroachment occurs as described above, a positive voltage of 1.0 V is applied to the semiconductor substrate 100 by the silicide layer 280S, which is electrically connected to a positive voltage FORCE (+) of about 1.0 V and formed up to the lower part of the spacer 240 (that is, lateral encroachment). As a result, a forward diode is turned on between the semiconductor substrate 100 and the first junction region 270 connected to the ground voltage GND so that a current flows in the direction indicated by the arrow (a). Accordingly, the drain-off current Idoff of the transistor array 200 is greatly increased compared with the case of the normal state.

As to current path (b), a current passes through the insulating layers 530 and 630 of the first and second connecting portions 500 and 600 using FN tunneling phenomenon.

With regard to current path (c), since the wells 540 and 640 having the same conductivity type as the first and second junction regions 270 and 290 are formed on the lower parts of the first and second main active regions 261 and 281 and the semiconductor substrate 100 or a well (not shown) of the conductivity type opposite to the wells 540 and 640 is formed on the lower parts of the first and second sub-active regions 262 and 282, a leakage current may occur at an interface between the wells 540 and 640 and the semiconductor substrate 100 or the well.

Figure 4:
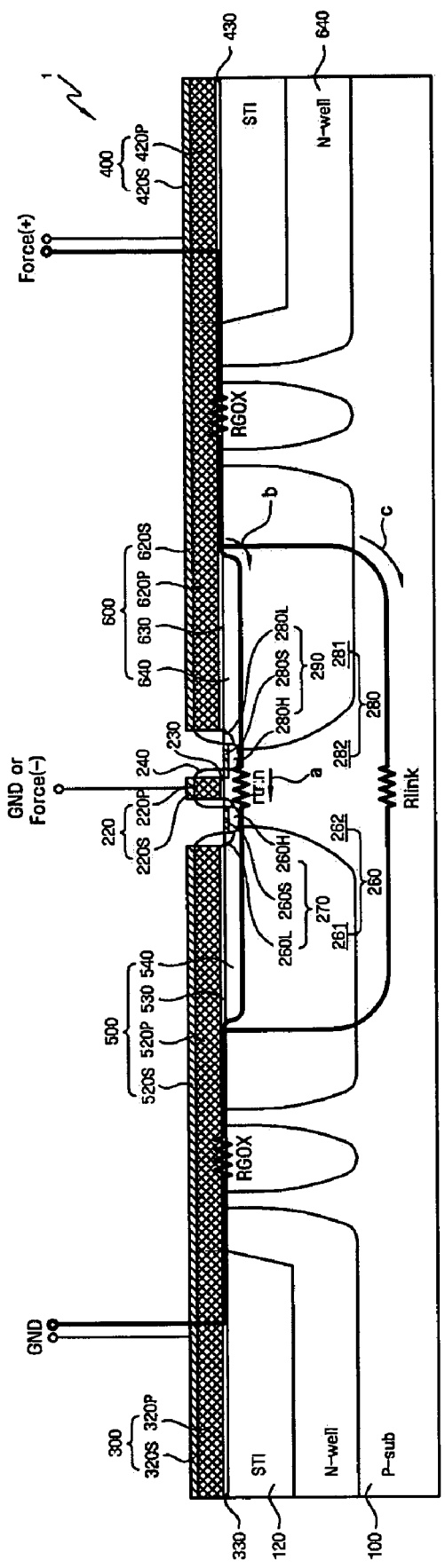
FIG. 4 together shows a cross-sectional view of the test structure, taken along the line II-II' shown in FIG. 1, and its resistance.
Figure 5:
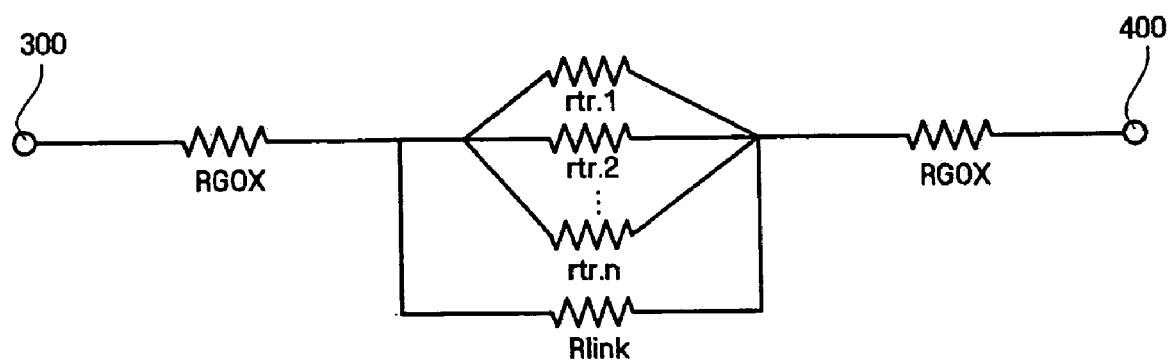
FIG. 5 illustrates the resistance of the semiconductor device according to one embodiment of the present invention.

The resistance of the test structure 1 of the semiconductor device including the transistor array 200 comprised of the n-numbered transistors $200a, 200b, \ldots, 200n$ can be expressed in consideration of the current paths (a), (b) and (c), as shown in FIGS. 4 and 5. If the resistance of the n-numbered transistors $200a, 200b, \ldots, 200n$ is constant to r and the resistance $R_{LINK}$ between the semiconductor substrate 100 and the wells 540 and 640 is sufficiently large, the total resistance $R_{tot}$ can be approximated to $2R_{GOX}+r/n$ as in the following Equation 1. To approximate to $2R_{GOX}+r/n$, the resistance $R_{LINK}$ between the semiconductor substrate 100 and the wells 540 and 640 must be sufficiently large. Accordingly, the contact active regions 265 and 285 (refer to FIG. 2) connecting the first and second main active regions 261 and 281 to the first and second sub-active regions 262 and 282 must have as small a contact area as possible. The contact active regions 265 and 285 preferably have a width having the margin resolution of a photolithography process.

$$R_{tot} = 2R_{GOX} + \frac{1}{\sum (1/r_{tr,n}) + \frac{1}{R_{LINK}}} \approx 2R_{GOX} + r/n \quad \text{[Equation 1]}$$

If the n-numbered transistors $200a, 200b, \ldots, 200n$ are all in a healthy, normal state and a relationship of $r/n \gg 2R_{GOX}$ is satisfied, the total resistance $R_{tot,\ healthy}$ in a healthy state can be approximated to $r/n$ as in the following Equation 2.

$$R_{tot,healthy} \approx 2R_{GOX} + r/n \approx r/n \quad \text{[Equation 2]}$$
$$(\because r/n \gg R_{GOX})$$

If the lateral encroachment phenomenon occurs in one transistor $200a$ among the n-numbered transistors $200a, 200b, \ldots, 200n$, the total resistance $R_{tot.\ leaky}$ can be approximated to $2R_{GOX}$ as in the following Equation 3, which is because a resistance $r_{leaky}$ of the transistor with leakage current due to lateral encroachment is very small.

$$R_{tot.leaky} = 2R_{GOX} + r_{leaky} \approx 2R_{GOX} \quad \text{[Equation 3]}$$

$$\left( \because \sum (1/r_{tr,n}) \approx 1/r_{leaky}, r_{leaky} << r \right)$$

Generally, it is known that the drain off current Idoff of the normal transistors 200a, 200b, . . . , 200n having a width of 0.1 μm is 10 nA/μm when a positive voltage FORCE (+) of 1.0V is applied. Accordingly, in a case where the transistor array 200 is comprised of one thousand transistors 200a, 200b, . . . , 200n, the current $I_{tot.\ healthy}$ in a healthy state of the transistor array 200 is 1 μA, as obtained as follows.

$$I_{tot.\ healthy} = 1000 \times 10^{-8} \times 0.1 = 10^{-6} \quad \text{[Equation 4]}$$

Accordingly, the leakage current $I_{tot,\ leaky}$ in the lateral encroached state must be about 100 times larger than the current $I_{tot,\ healthy}$ in the healthy state, thereby enabling accurate detection. That is, the leakage current $I_{tot,\ leaky}$ in the lateral encroachment state must be about 0.1 mA.

Accordingly, the following relationship must be satisfied.

$$\frac{I_{tot.healthy}}{I_{tot.leaky}} = \frac{10^{-6}}{10^{-4}} = \frac{1}{100} = \frac{2R_{GOX}}{r/n} = \frac{R_{tot.leaky}}{R_{tot.healthy}} \quad \text{[Equation 5]}$$

Specifically, if the current $I_{tot.\ healthy}$ in the healthy state is 1 μA and a voltage Vdd applied to both ends of the insulating layers 530 and 630 is 1.0 V, the total resistance $R_{tot,\ healthy}$ in the healthy state, that is, r/n, is $10^6$ Ω.

Meanwhile, it is known that in a case where the voltage applied to both ends of the insulating layers 530 and 630 is 1.0 V, a pass current $I_{GOX}$ per unit area (μm') of the insulating layers 530 and 630 is about $10^{-7}$ A/μm'. Accordingly, the resistance per unit area of the insulating layers 530 and 630 is $10^7$ Ωμm'.

Accordingly, the total area of the insulating layers 530 and 630 must be 1000 μm' or more so that the total resistance $R_{tot.\ leaky}$, that is, $2R_{GOX}$ in the occurrence of the lateral encroachment can be 100 or more times smaller than the total resistance $R_{tot,\ healthy}$ in the healthy state, that is, r/n, as stated in Equation 5.

The total area of the insulating layers 530 and 630 is not limited to the above-mentioned value, and the total area of the insulating layers 530 and 630 can be adjusted according to the test accuracy required.

The test structure 1 of the semiconductor device according to one embodiment of the present invention is completed by performing only a silicide formation process. According to the present invention, the semiconductor device can be tested immediately after performing the silicide formation process without performing an additional metallization process. Thus, it is possible to clearly identify whether or not a failure of the semiconductor device is caused by lateral encroachment generated during the silicide formation process, and to provide a highly reliable test result. Further, since a probe to which a voltage for the test is applied is placed on a pad formed on a shallow trench isolation (STI) region, the semiconductor device is not damaged by the probe. Since testing is conducted on the semiconductor device including the transistor array 200 comprised of the plurality of transistors 200a, 200b, . . . , 200n, the probability of lateral encroachment occurring during the silicide formation process can also be statistically analyzed. Moreover, the lateral encroachment of the silicide layer can be measured immediately after performing the silicide formation process, that is, at an initial stage of a semiconductor device integration process. Once a failure occurs to a semiconductor device, it is not necessary to perform processes subsequent to the silicide formation process on the defective semiconductor device, thereby reducing the process cost.

Figure 6:
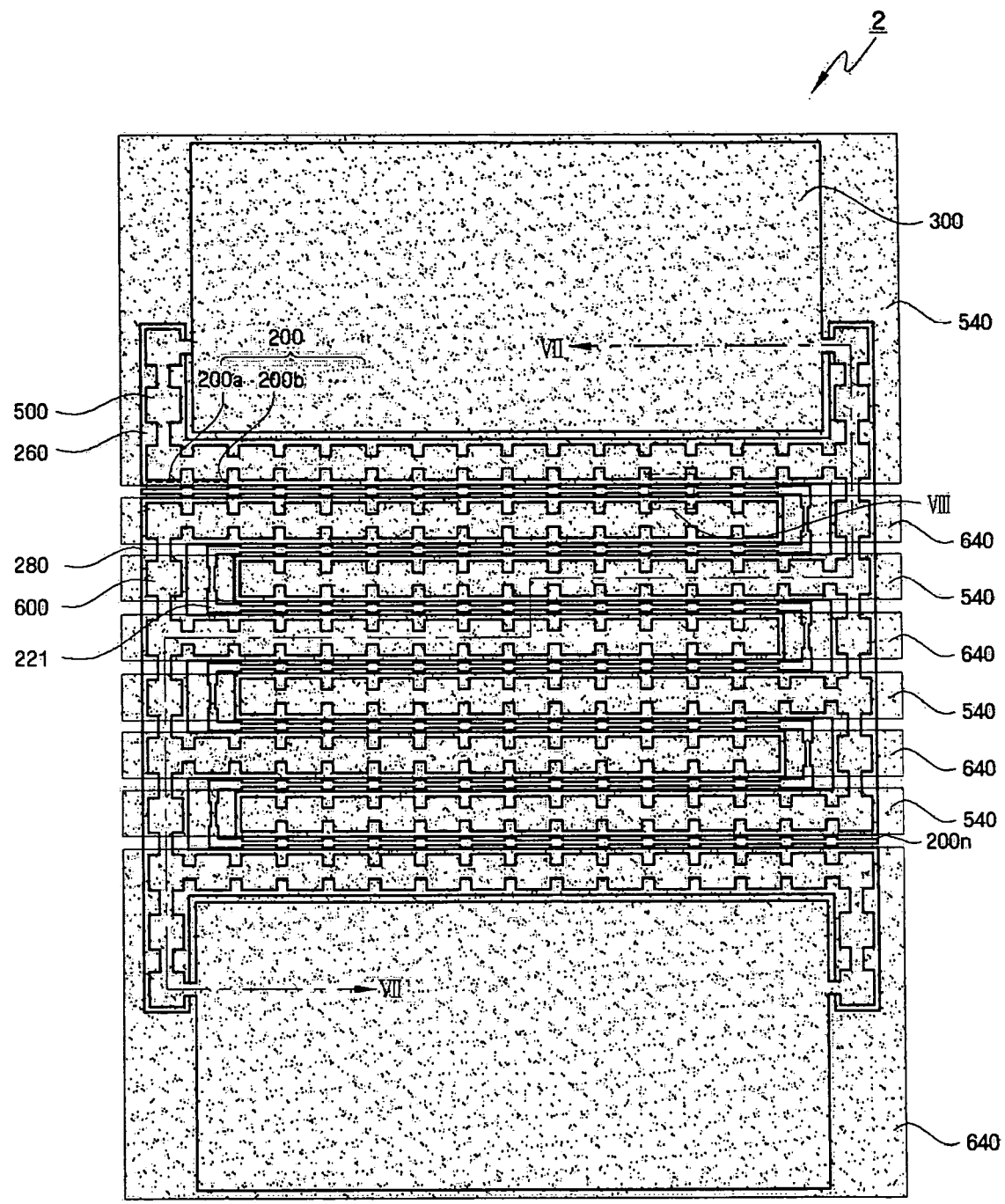
FIG. 6 is a layout diagram of a test structure of a semiconductor device according to another embodiment of the present invention.
Figure 7:
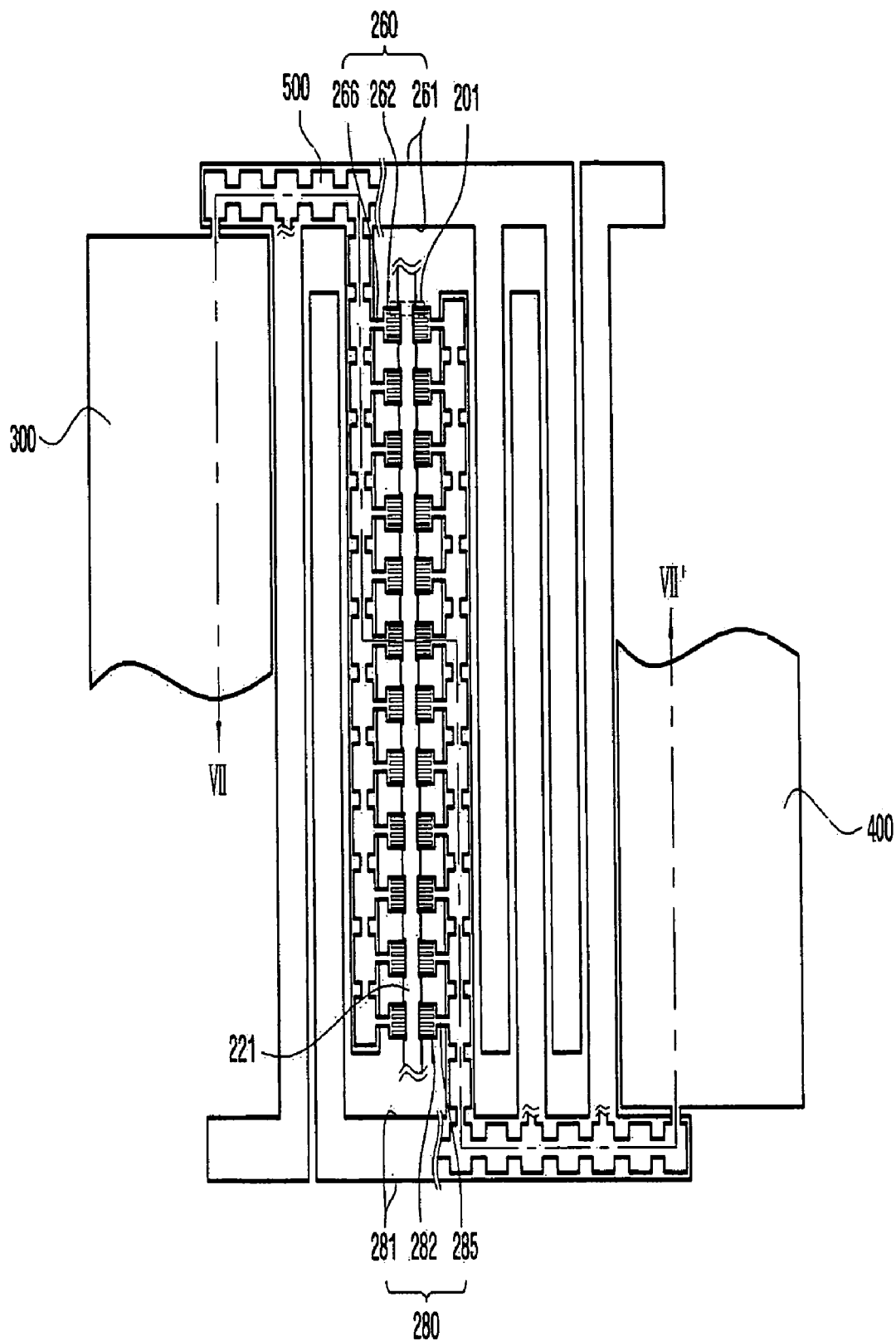
FIG. 7 is a layout diagram enlarged along a line VII-VII' shown in FIG. 6.
Figure 8:
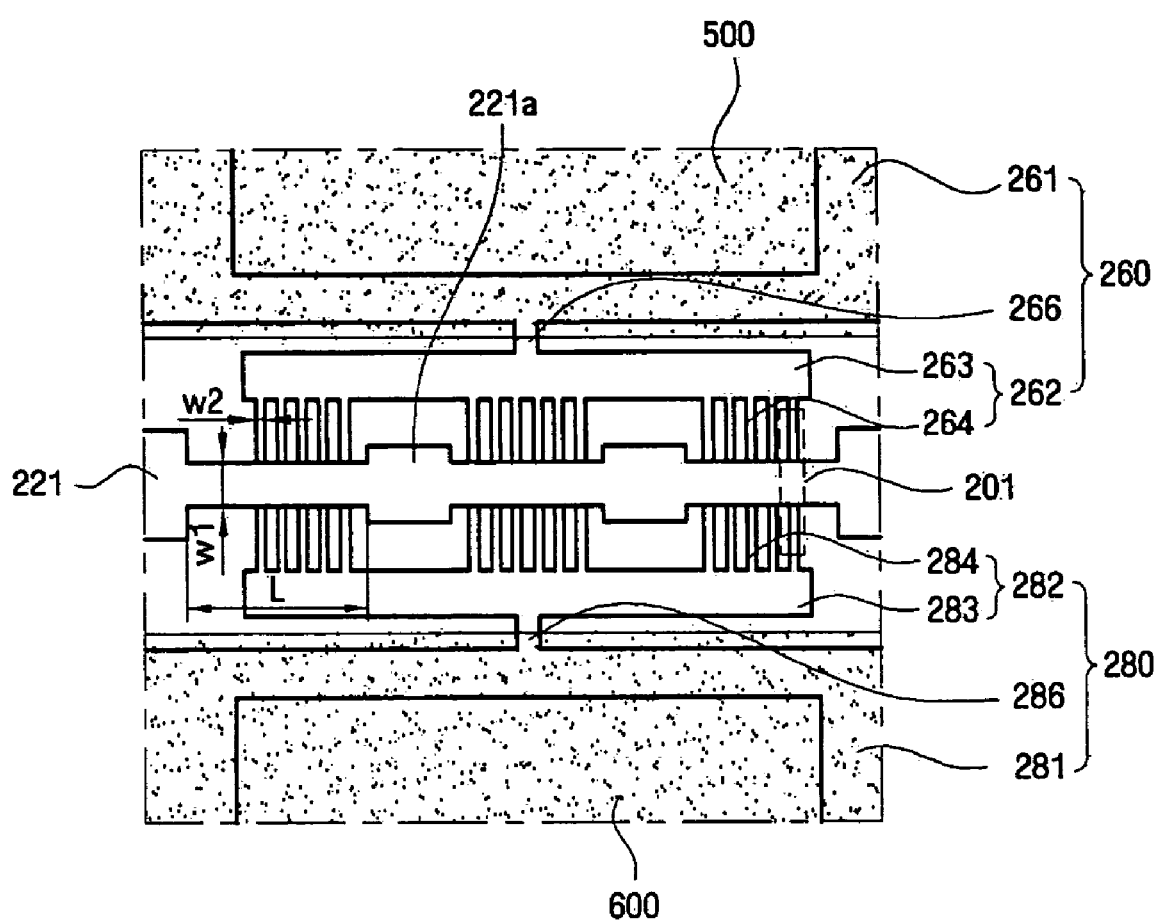
FIG. 8 is a partially enlarged layout diagram of a region VIII shown in FIG. 6.

FIG. 6 is a layout diagram of a test structure of a semiconductor device according to another embodiment of the present invention. FIG. 7 is a layout diagram enlarged along a line VII-VII' shown in FIG. 6. FIG. 8 is a partially enlarged layout diagram of a region VIII shown in FIG. 6. In FIG. 7, only first and second pads, first and second active regions, and connecting portions shown along the line VII-VII' are shown. A well is not shown. Structures and components identical or equivalent to those described in the first embodiment are designated by the same reference numerals, and descriptions thereof will not be given.

Referring to FIGS. 6 through 8, another embodiment of the present invention is nearly the same as the first embodiment of the present invention, however a plurality of transistors 200a, 200b, . . . , 200n are each comprised of a plurality of sub-transistors 201 which are connected to one another in parallel. To form the plurality of sub-transistors 201, first and second active regions 260 and 280 include first and second main active regions 261 and 281 arranged in a cross-finger array and a plurality of first and second sub-active regions 262 and 282 connected thereto, respectively. The plurality of first and second sub-active regions 262 and 282 are connected to the first and second main active regions 261 and 281, respectively, allowing the first and second active regions 260 and 280 to be interconnected. Further, the plurality of first and second sub-active regions 262 and 282 are arranged between each of the first and second main active regions 261 and 281 facing and opposite to each other, respectively, so that the plurality of transistors 200a, 200b, . . . , 200n are formed on the plurality of first and second sub-active regions 262 and 282. Here, the first and second sub-active regions 262 and 282 include first and second common sub-active regions 263 and 283 and a plurality of first and second branch sub-active regions 264 and 284 connecting the first and second common sub-active regions 263 and 283 to form each of the plurality of transistors 200a, 200b, . . . , 200n comprised of the plurality of sub-transistors 201 which are connected to one another in parallel.

A gate electrode 221 can have a width W1 having the margin resolution of a photolithography process according to a space between the first and second main active regions 261 and 281. With the proviso that the gate electrode 221 having the width W1 is extended, a middle portion 221a can be formed in a portion corresponding to a margin length L. Further, the narrower the width W2 of the first and second branch sub-active regions 264 and 284 is, the larger the number of the sub-transistors 201 is. Accordingly, it is preferable that the width W2 of the first and second branch sub-active regions 264 and 284 has the margin resolution of a photolithography process Since wells 540 and 640 (see FIG. 2) having a conductivity type different from the semiconductor substrate 100 are formed on the lower parts of the first and second main active regions 261 and 281 and the semiconductor substrate 100 is formed on lower parts of the first and second sub-active regions 262 and 282, a leakage current may occur at the interface between the wells 540 and 640 and the semiconductor substrate 100. Accordingly, it is preferable that the contact areas of contact active regions 266 and 286 connecting the first and second main active regions 261 and 281 to the first and second sub-active regions 262 and 282 is as small as possible. The contact active regions 266 and 286 can have a width having the margin resolution of a photolithography process.

In general, as the transistor becomes smaller, the widths of the gate electrode and the spacer are reduced. Thus, a lateral encroachment phenomenon occurs more frequently in a narrow active region than in a wide active region. Accordingly, the sensitivity of the test structure 2 of the semiconductor device according to another embodiment of the present invention can be increased by forming the plurality of sub-transistors 201 in a narrow region.

Hereinafter, a test structure of a semiconductor device including first and second pads formed on the same level as a semiconductor substrate will be described with reference to FIGS. 9 through 14.

Figure 9:
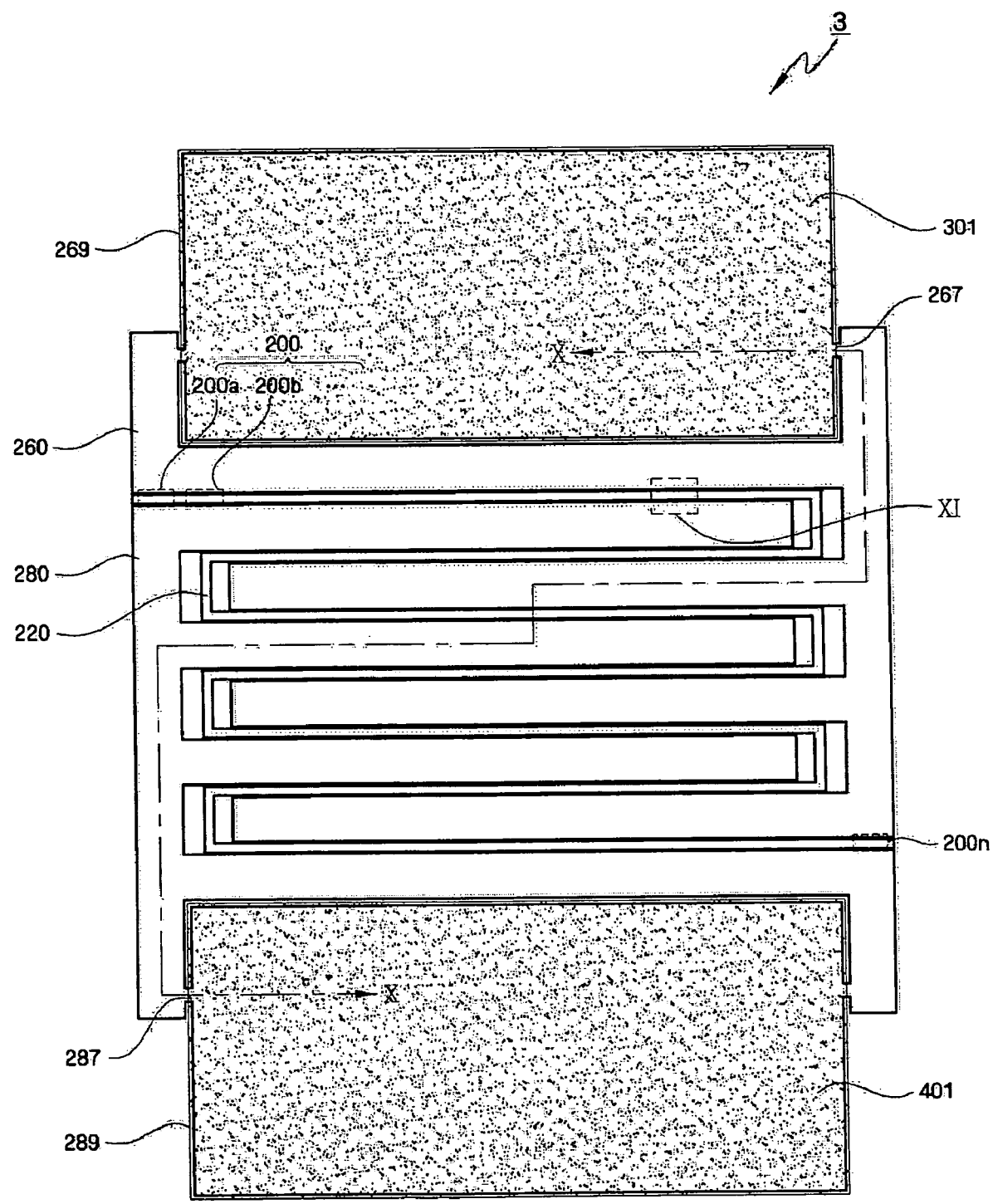
FIG. 9 is a layout diagram of a test structure of a semiconductor device according to still another embodiment of the present invention.
Figure 10:
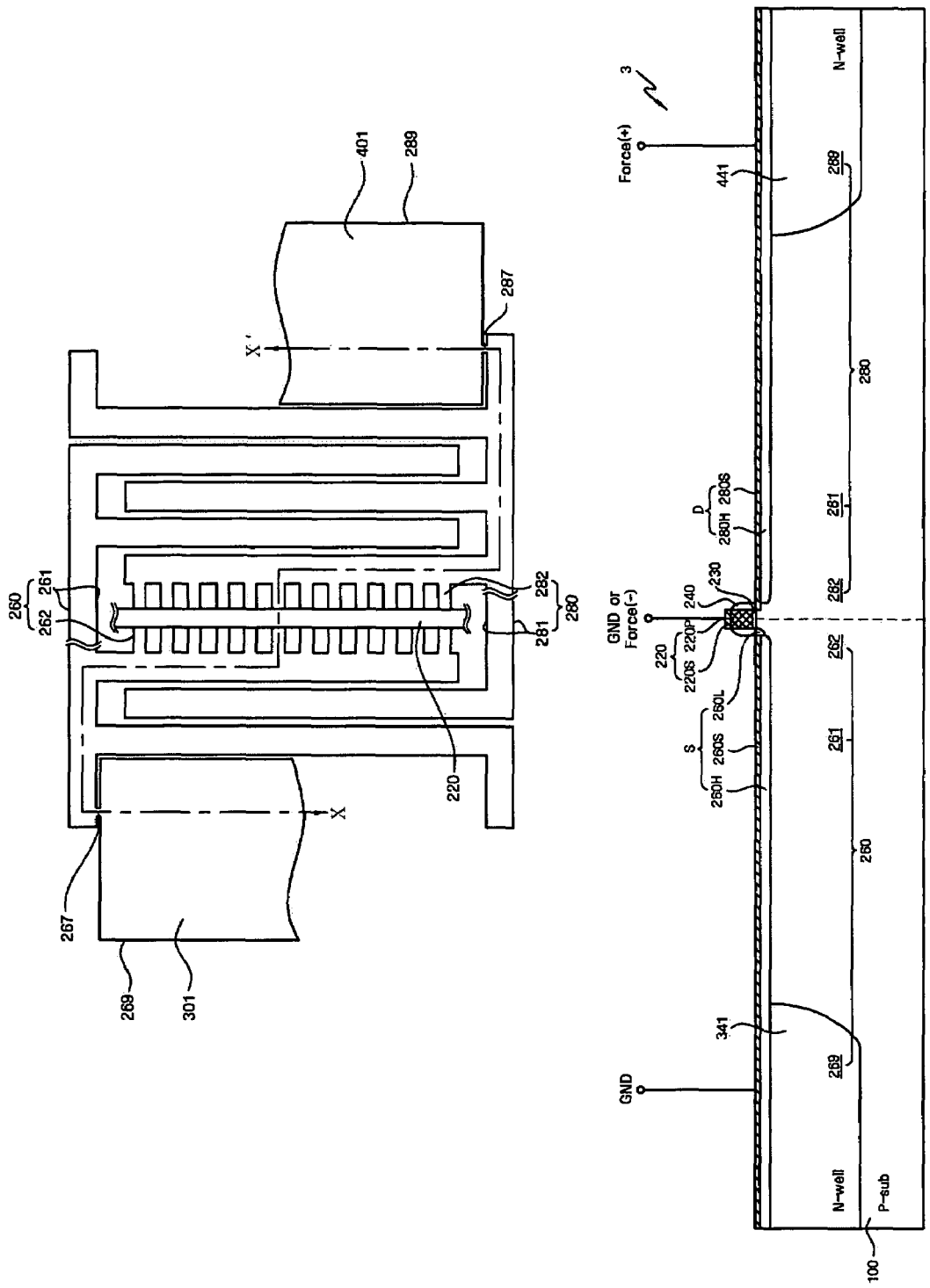
FIG. 10 together shows a cross-sectional view taken along a line X-X' shown in FIG. 9 and an enlarged layout diagram along the line X-X'.
Figure 11:
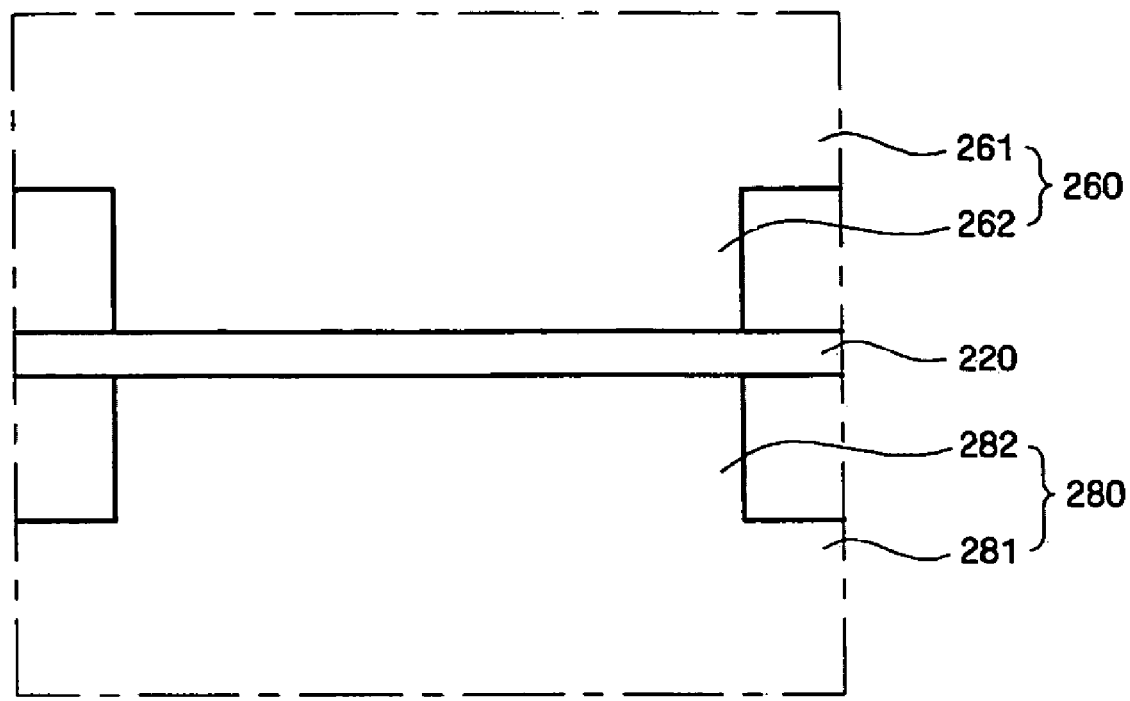
FIG. 11 is a partially enlarged layout diagram of a region XI shown in FIG. 10.

FIG. 9 is a layout diagram of a test structure of a semiconductor device according to still another embodiment of the present invention, FIG. 10 together shows a cross-sectional view taken along a line X-X' shown in FIG. 9 and an enlarged layout diagram along the line X-X', and FIG. 11 is a partially enlarged layout diagram of a region XI shown in FIG. 10. In FIG. 10, only first and second pads, first and second active regions, and connecting portions shown along the line X-X' are shown. Structures and components identical or equivalent to those described in the above-described embodiment are designated by the same reference numerals, and descriptions thereof will not be given.

Referring to FIG. 9 through 11, a test structure 3 of a semiconductor device according to still another embodiment of the present invention includes a semiconductor substrate 100, a transistor array 200, a first pad 301 and a second pad 401.

The transistor array 200 and the first and second pads 301 and 401 are formed on first and second active regions 260 and 280 and the first and second active regions 260 and 280 are defined by a field isolation region 120 formed within the semiconductor substrate 100. The first and second active regions 260 and 280 include first and second main active regions 261 and 281 where the transistor array 200 is formed, a plurality of first and second sub-active regions 262 and 282, and first and second pad active regions 269 and 289 on which the first and second pads 301 and 401 are formed, respectively. The first and second main active regions 261 and 281 are arranged in a cross-finger array, and the plurality of first and second sub-active regions 262 and 282 are connected to the first and second main active regions 261 and 281, respectively, allowing the first and second active regions 260 and 280 to be interconnected. Further, the plurality of first and second sub-active regions 262 and 282 are arranged between the first and second main active regions 261 and 281 facing and opposite to each other, respectively, so that a plurality of transistors 200a, 200b, . . . , 200n are formed on the plurality of first and second sub-active regions 262 and 282.

The respective plurality of transistors 200a, 200b, . . . , 200n will now be described in more detail. A gate electrode 220 is insulated from the semiconductor substrate 100 and is formed on the plurality of first and second sub-active regions 262 and 282, as described above referring to FIGS. 1 through 5. A predetermined voltage is applied to the gate electrode 220 to form a channel region on a lower part of the gate electrode 220. First and second junction regions 270 and 290, that is, source/drain regions of each of the plurality of transistors 200a, 200b, . . . , 200n are formed by doping n-type or p-type impurities on the first and second active regions 260 and 280 according to a type of the test structure 3 of the semiconductor device which is to be formed. The source/drain regions can include lightly doped drains 260L and 280L and heavily doped drains 260H and 280H. Further, the first and second junction regions 270 and 290 include silicide layers 260S and 280S. To detect occurrence of lateral encroachment of silicide, the silicide layers 260S and 280S are formed on upper parts of the first and second junction regions 270 and 290 which are arranged at both sidewalls of the gate electrode 220 and formed on the first and second active regions 260 and 280.

The first and second pads 301 and 401 are well pads comprised of wells 341 and 441 formed on the lower parts of the first and second pad active regions 269 and 289. The first and second pads 301 and 401 are formed on the same level as the semiconductor substrate 100. The first and second pads 301 and 401 are wells formed of a material having the same conductivity type as the first and second junction regions 270 and 290. Accordingly, in a case where the first and second junction regions 270 and 290 are formed by doping n-type impurities, the wells 341 and 441 constituting the first and second pads 301 and 401 are also formed by doping n-type impurities. Accordingly, although a probe is placed on the first and second pads 301 and 401, junction breakdown does not occur. Further, although it is not shown in the drawings, conductive wells having a conductivity type different from the wells 341 and 441 may be formed between the wells 341 and 441 constituting the first and second pads 301 and 401 according to the operation characteristic of the test structure 3 of the semiconductor device.

In addition, since the first and second pads 301 and 401 are not formed on the field isolation region 120 and are comprised of the wells 341 and 441 having the same conductivity type as the first and second junction regions 270 and 290 on the lower parts of the first and second junction regions 270 and 290 constituting each of the plurality of transistors of the transistor array 200, it is not necessary to provide additional first and second connecting portions (refer to reference numerals 500 and 600 shown in FIG. 2) to connect the first and second pads 301 and 401 to the first and second junction regions 270 and 290.

Meanwhile, it is preferable that contact areas of contact active regions 267 and 287 connecting the first and second pad active regions 269 and 289 to the first and second main active regions 261 and 281 are reduced. The widths of the contact active regions 267 and 287 may have the margin resolution of a photolithography process. The contact areas and the widths of the contact active regions 267 and 287 are set as described above, because the wells 341 and 441 on lower parts of the first and second pad active regions 269 and 289 have a conductivity type different from the semiconductor substrate 100 on lower parts of the first and second main active regions 261 and 281 so that a leakage current can be generated at an interface between the wells 341 and 441 and the semiconductor substrate 100.

Conversely, it is not necessary to separately form contact active regions (refer to reference numerals 265 and 285 shown in FIG. 2) between the first and second main active regions 261 and 281 and the first and second sub-active regions 262 and 282, as opposed to the above-described embodiment of the present invention. This is because the substrate 100 having the same conductivity type is formed on the lower parts of the first and second main active regions 261 and 281 and the lower parts of the first and second sub-active regions 262 and 282 so that a leakage current is not generated at an interface therebetween.

In the test structure 3 of the semiconductor device according to still another embodiment of the present invention, no conductive polysilicon layer is formed on the field isolation region 120. Thus, the test structure 3 of the semiconductor device can be fabricated through as small a number of processing steps as possible.

Figure 12:
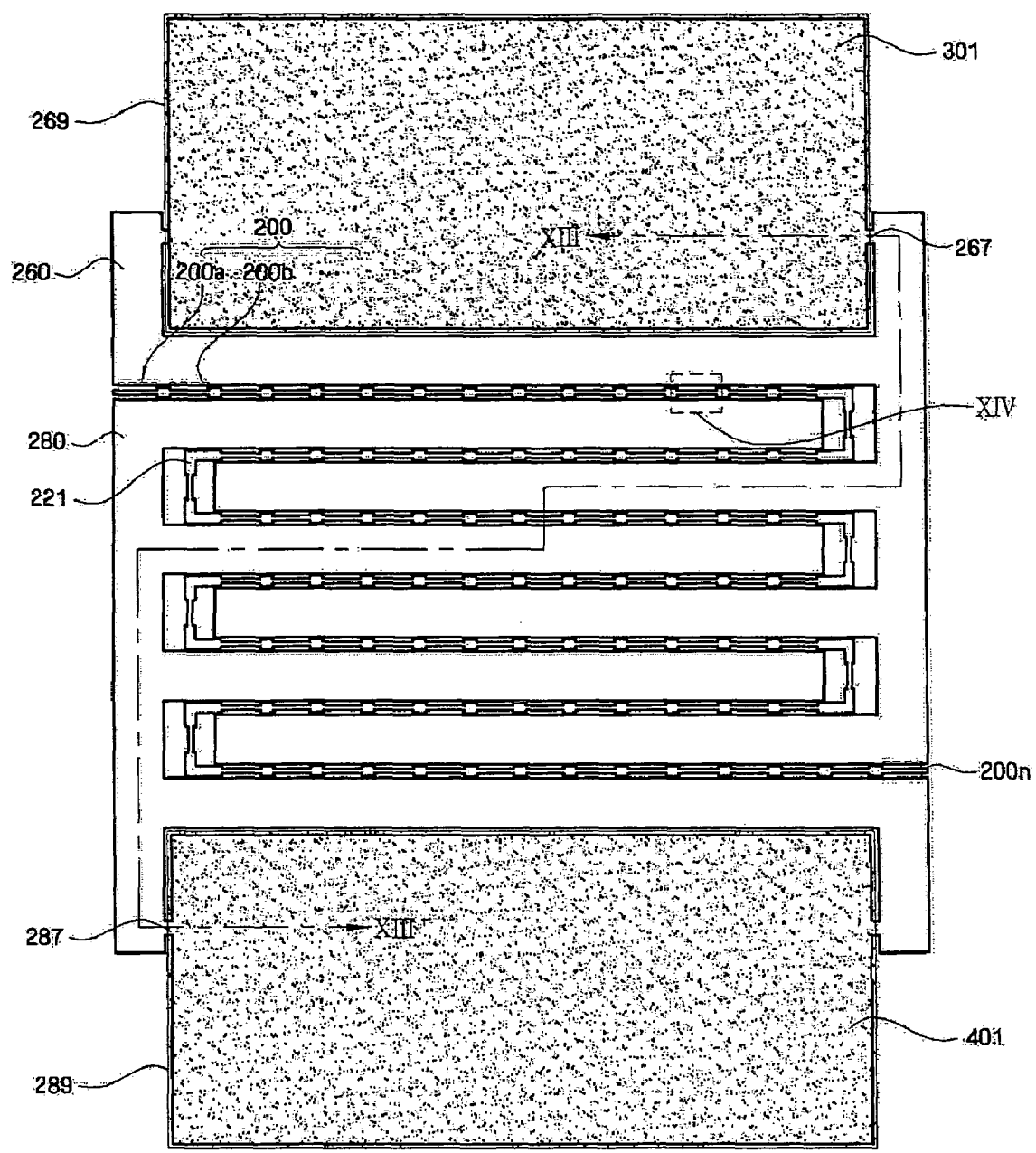
FIG. 12 is a layout diagram of a test structure of a semiconductor device according to a further embodiment of the present invention.
Figure 13:
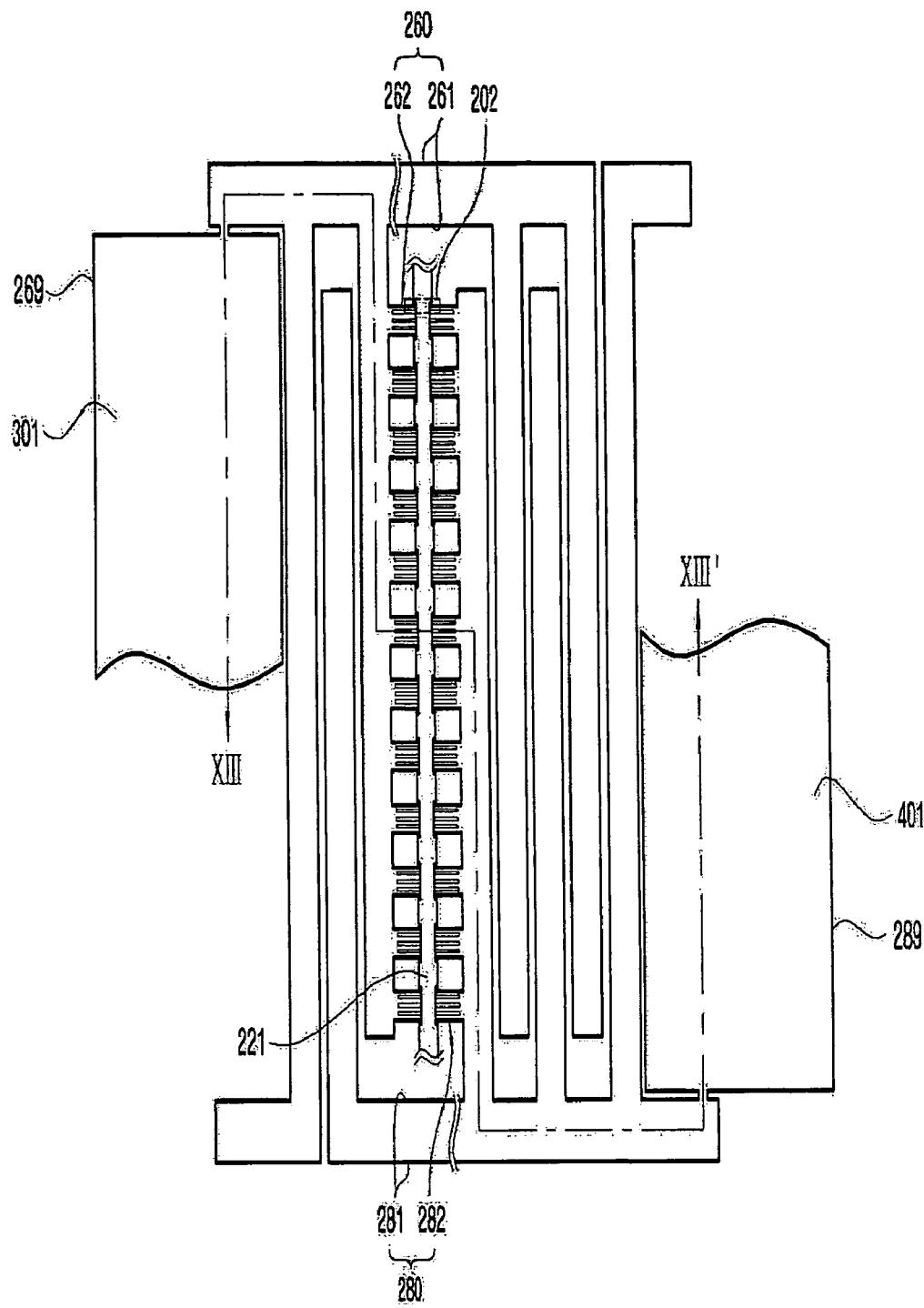
FIG. 13 is a layout diagram enlarged along a line XIII-XIII' shown in FIG. 12.
Figure 14:
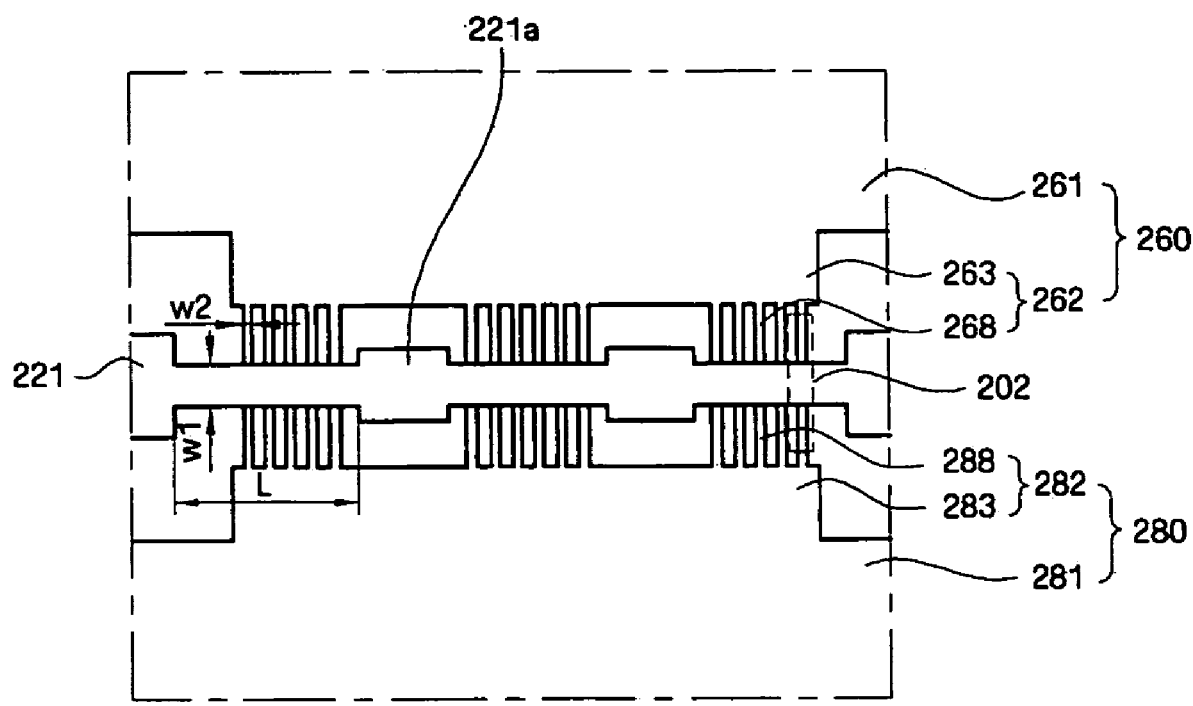
FIG. 14 is a partially enlarged layout diagram of a region XIV shown in FIG. 12.

FIG. 12 is a layout diagram of a test structure of a semiconductor device according to a further embodiment of the present invention, FIG. 13 is a layout diagram enlarged along a line XIII-XIII' shown in FIG. 12, and FIG. 14 is a partially enlarged layout diagram of a region XIV shown in FIG. 12. In FIG. 13, only first and second pads, first and second active regions, and connecting portions shown along the line XIII-XIII' are shown. Structures and components identical or equivalent to those described in the above-described embodiment are designated by the same reference numerals, and descriptions thereof will not be given.

In a further embodiment of the present invention, as shown in FIGS. 12 through 14, a plurality of transistors 200a, 200b, . . . , 200n are each comprised of a plurality of sub-transistors 202 which are connected to one another in parallel. To constitute the plurality of sub-transistors 202, first and second active regions 260 and 280 include first and second main active regions 261 and 281 where a transistor array 200 is formed, a plurality of first and second sub-active regions 262 and 282, and first and second pad active regions 269 and 289 having first and second pads 301 and 401 formed therein, respectively. The first and second main active regions 261 and 281 are arranged in a cross-finger array. The plurality of first and second sub-active regions 262 and 282 are connected to the first and second main active regions 261 and 281, respectively, allowing the first and second active regions 260 and 280 to be interconnected. Further, the plurality of first and second sub-active regions 262 and 282 are arranged between the first and second main active regions 261 and 281, the first main active region 261 facing and opposite to the second main active region 281. Thus, the plurality of transistors 200a, 200b, . . . , 200n are formed on the plurality of first and second sub-active regions 262 and 282, respectively. Here, the first and second sub-active regions 262 and 282 include first and second common sub-active regions 263 and 283 and a plurality of first and second branch sub-active regions 268 and 288 connecting the first and second common sub-active regions 263 and 283 to form each of the plurality of transistors 200a, 200b, . . . , 200n comprised of the plurality of sub-transistors 202.

A gate electrode 221 can have a width W1 having the margin resolution of the photolithography process according to the space between the first and second main active regions 261 and 281. With the proviso that the gate electrode 221 having the width W1 is extended, a middle portion 221a can be formed in a portion corresponding to a margin length L. Further, the narrower the width W2 of the first and second branch sub-active regions 268 and 288 is, the larger the number of the sub-transistors 202 is. Accordingly, it is preferable that the widths W2 of the first and second branch sub-active regions 268 and 288 have a width having the margin resolution of a photolithography process.

It is preferable that the contact areas of contact active regions 267 and 287 connecting the first and second main active regions 261 and 281 to the first and second pad active regions 269 and 289 are reduced. Further, the widths of the contact active regions 267 and 287 may have the range of the margin resolution for a photolithography process. This is because wells 341 and 441 on lower parts of the first and second pad active regions 269 and 289 have a conductivity type different from the semiconductor substrate 100 on lower parts of the first and second main active regions 261 and 281 so that a leakage current may be generated at an interface between the wells 341 and 441 and the semiconductor substrate 100.

In general, as the transistor becomes smaller, widths of the gate electrode and the spacer are reduced. Thus, a lateral encroachment phenomenon occurs more frequently in a narrow active region than in a wide active region. Accordingly, the sensitivity of the test structure 4 of the semiconductor device according to still another embodiment of the present invention can be increased by forming the plurality of sub-transistors 202 in a narrow region.

The test structure of the semiconductor device according to an embodiment of the present invention provides at least the following:

First, a lateral encroachment phenomenon can be tested after performing a silicide formation process without a separate metallization process, thereby reducing the fabrication cost.

Second, whether the failure is caused by the metallization process or the silicide formation process can be identified.

Third, the occurrence of lateral encroachment phenomenon in the silicide formation process can be measured through a statistical analysis.

Those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A test structure of a semiconductor device comprising:
   a semiconductor substrate;
   a transistor which includes a gate electrode formed on first and second active regions defined within the semiconductor substrate, and first and second junction regions which are arranged at both sidewalls of the gate electrode to reside within the first and second active regions and are silicided; and
   first and second pads electrically connected respectively to the silicided first and second junction regions for receiving an application of an electrical signal and outputting a detected signal, wherein the first and second pads are formed on the same level as the gate electrode or the semiconductor substrate.

2. The test structure of claim 1, wherein at least some of the first and second pads formed on the same level as the gate electrode are formed on a field isolation region defining the first and second active regions.

3. The test structure of claim 2, further comprising a first connecting portion connecting the first pad to the first active region and a second connecting portion connecting the second pad to the second active region.

4. The test structure of claim 3, wherein the first and second connecting portions include wells having the same conductivity type as the first and second junction regions, insulating layers formed on the wells, and auxiliary pads that are electrically connected to the first and second pads.

5. The test structure of claim 3, wherein the overall area of the first and second connecting portions is sized and positioned such that the resistance of the first and second connecting portions is smaller than the resistance of the transistor.

6. The test structure of claim 5, wherein the resistance of the first and second connecting portions are 100 or more times smaller than the resistance of the transistor.

7. The test structure of claim 1, wherein the first and second pads formed on the same level as the semiconductor substrate are well pads which are formed on a portion of lower parts of the first and second junction regions and have the same conductivity type as the first and second junction regions.

8. The test structure of claim 7, wherein first and second pad active regions respectively included in the first and second active regions having the well pads formed thereon are connected to regions other than the first and second pad active regions of the first and second active regions through contact active regions that have a width having the margin resolution of a photolithography process.

9. The test structure of claim 1, wherein the first pad is connected to a ground voltage, the second pad is connected to a positive voltage, and the gate electrode is connected to a voltage that disturbs channel formation.

10. A test structure of a semiconductor device comprising:
a semiconductor substrate;
a transistor array which includes a gate electrode formed on first and second active regions defined within the semiconductor substrate, and first and second junction regions which are arranged at both sidewalls of the gate electrode to reside within the first and second active regions and are silicided;
first and second pads electrically connected respectively to the silicided first and second junction regions for receiving an application of an electrical signal and outputting a detected signal, wherein the first and second pads are formed on the same level as the gate electrode; and
first and second connecting portions which respectively connect the first and second pads to the first and second junction regions.

11. The test structure of claim 10, wherein at least some of the first and second pads formed on the same level as the gate electrode are formed on a field isolation region defining the first and second active regions.

12. The test structure of claim 10, wherein the first and second connecting portions include wells having the same conductivity type as the first and second junction regions, insulating layers formed on the wells, and auxiliary pads that are electrically connected to the first and second pads.

13. The test structure of claim 10, wherein the overall area of the first and second connecting portions is sized and positioned such that the resistance of the first and second connecting portions is smaller than the resistance of the transistor.

14. The test structure of claim 13, wherein the resistance of the first and second connecting portions are 100 or more times smaller than the resistance of the transistor.

15. The test structure of claim 10, wherein the first and second active regions include first and second main active regions arranged in a cross-finger array and a plurality of first and second sub-active regions which are connected to the first and second main active regions, allowing the first and second active regions to be interconnected, and which are arranged between the first and second main active regions facing and opposite to each other, respectively, so that transistors constituting the transistor array are formed on the plurality of first and second sub-active regions; and
wherein the first and second connecting portions are formed on the first and second main active regions, respectively, the first and second connecting portions arranged in a cross-finger array.

16. The test structure of claim 15, wherein each of the transistors constituting the transistor array includes a plurality of sub-transistors which are connected to one another in parallel, and wherein the first and second sub-active regions include first and second common sub-active regions, respectively, and a plurality of first and second branch sub-active regions respectively connecting the first and second common sub-active regions to constitute the plurality of sub-transistors which are connected to one another in parallel to form the transistors.

17. The test structure of claim 16, wherein the first and second branch sub-active regions have a width having the margin resolution of a photolithography process.

18. The test structure of claim 15, wherein the first and second main active regions are connected to the first and second sub-active regions through contact active regions that have a width having the margin resolution of a photolithography process.

19. The test structure of claim 16, wherein gate electrodes of each transistor have a width having the margin resolution of a photolithography process.

20. The test structure of claim 10, wherein the first pad is connected to a ground voltage, the second pad is connected to a positive voltage, and the gate electrode is connected to a voltage that disturbs channel formation.

21. A test structure of a semiconductor device comprising:
a semiconductor substrate;
a transistor array which includes a gate electrode formed on first and second active regions defined within the semiconductor substrate, and first and second junction regions which are arranged at both sidewalls of the gate electrode to reside within the first and second active regions and are silicided; and
first and second pads electrically connected respectively to the silicided first and second junction regions for receiving an application of an electrical signal and outputting a detected signal, wherein the first and second pads are formed on the same level as the semiconductor substrate.

22. The test structure of claim 21, wherein the first and second pads formed on the same level as the semiconductor substrate are well pads which are formed on a portion of lower parts of the first and second junction regions and have the same conductivity type as the first and second junction regions.

23. The test structure of claim 21, wherein first and second pad active regions respectively included in the first and second active regions having the well pads formed thereon are connected to regions other than the first and second pad active regions of the first and second active regions through contact active regions that have a width having the margin resolution of a photolithography process.

24. The test structure of claim 21, wherein the first and second active regions include first and second main active regions arranged in a cross-finger array and a plurality of first and second sub-active regions which are connected to the first and second main active regions, respectively, allowing the first and second active regions to be interconnected, and which are arranged between the first and second main active regions facing and opposite to each other, respectively, so that transistors constituting the transistor array are formed on the plurality of first and second sub-active regions.

25. The test structure of claim 21, wherein each of the transistors constituting the transistor array includes a plurality of sub-transistors which are connected to one another in parallel, and wherein the first and second sub-active regions include first and second common sub-active regions, respectively, and a plurality of first and second branch sub-active regions respectively connecting the first and second common sub-active regions to constitute the plurality of sub-transistors which are connected to one another in parallel to form the transistors.

26. The test structure of claim 25, wherein the first and second branch sub-active regions have a width having the margin resolution of a photolithography process.

27. The test structure of claim 25, wherein gate electrodes of each transistor have a width having the margin resolution of a photolithography process.

28. The test structure of claim 21, wherein the first pad is connected to a ground voltage, the second pad is connected to a positive voltage, and the gate electrode is connected to a voltage that disturbs channel formation.

* * * * *

UNITED STATES PATENT AND TRADEMARK OFFICE
CERTIFICATE OF CORRECTION

PATENT NO. : 7,317,204 B2  
APPLICATION NO. : 11/218397  
DATED : January 8, 2008  
INVENTOR(S) : Min-Chul Sun et al.

It is certified that error appears in the above-identified patent and that said Letters Patent is hereby corrected as shown below:

On the Title page, item [73] should read:

Name: Samsung Electronics Co., Ltd.  
Address: Suwon-Si, Geyonggi-do (Kr)

Name: International Business Machines Corporation  
Address: Armonk, New York 10504

Name: Infineon Technologies AG  
Address: AM Campeon 1-12, Neubiberg, Germany 85579

Name: Chartered Semiconductor Manufacturing Ltd.  
Address: 60 Woodlands, Industrial Park, D Street 2, Singapore 738406

Signed and Sealed this

Fourth Day of November, 2008

JON W. DUDAS  
*Director of the United States Patent and Trademark Office*